United States Patent
Millette et al.

Patent Number: 5,723,205
Date of Patent: Mar. 3, 1998

[54] FABRICATION MULTILAYER COMBINED RIGID/FLEX PRINTER CIRCUIT BOARD

[75] Inventors: Lee J. Millette, Litchfield; A. Roland Caron, Hudson; Joseph A. Thoman, Manchester, all of N.H.

[73] Assignee: Teledyne Industries, Inc., Los Angeles, Calif.

[21] Appl. No.: 702,729

[22] PCT Filed: Mar. 8, 1994

[86] PCT No.: PCT/US94/02437
§ 371 Date: Sep. 6, 1996
§ 102(e) Date: Sep. 6, 1996

[87] PCT Pub. No.: WO95/24821
PCT Pub. Date: Sep. 14, 1995

[51] Int. Cl.$^6$ .............. H05K 3/06; H05K 3/00
[52] U.S. Cl. .............. 428/209; 428/901; 361/728; 361/746; 361/749; 361/750; 156/264; 156/291; 156/578; 156/629; 156/634; 156/656; 156/902; 174/254; 174/259
[58] Field of Search .............. 428/209, 901, 428/209.901; 361/728, 746, 749, 750; 156/264, 291, 578, 629, 634, 656, 902; 174/254, 259

[56] References Cited

U.S. PATENT DOCUMENTS

| | | | |
|---|---|---|---|
| 3,433,888 | 3/1969 | Tally et al. | 174/256 |
| 4,687,695 | 8/1987 | Hamby | 428/192 |
| 4,735,847 | 4/1988 | Fujiwara et al. | 428/209 |
| 4,800,461 | 1/1989 | Dixon et al. | 361/398 |
| 5,144,742 | 9/1992 | Lucas et al. | 29/830 |

FOREIGN PATENT DOCUMENTS

| | | | |
|---|---|---|---|
| 0254082 | 1/1988 | European Pat. Off. | H05K 3/00 |
| 0348632 | 1/1990 | European Pat. Off. | H05K 3/06 |
| 2214939 | 9/1987 | Japan | B29D 9/00 |
| 2224294 | 9/1990 | Japan | H05K 3/00 |
| 2249219 | 4/1992 | United Kingdom | H05K 3/06 |
| 93/11652 | 6/1993 | WIPO | H05K 3/00 |

*Primary Examiner*—Patrick Ryan
*Assistant Examiner*—Cathy F. Lam
*Attorney, Agent, or Firm*—Hayes, Soloway, Hennessey, Grossman & Hage, P.C.

[57] ABSTRACT

A multilayer rigid flex printed circuit board, wherein the board laminate comprises a double-sided basestock composite, formed by laminating two conducting sheets (12 and 14) to an insulating layer, said insulator layer contacting a flexible core (20), a second insulator layer (24 and 26) affixed to each side of the basestock, said insulator having a cutout region proximate to the flexible core of the basestock composite, a flexible layer (28 and 30) affixed to said cutout regions with an adhesive, wherein said flexible layer contacts the conducting layers and abuts and overlaps a portion of the second insulator layer such that upon stacking of the board laminate a hollow region (32) is produced as between the stacked laminate sections.

15 Claims, 4 Drawing Sheets

FABRICATION MULTILAYER COMBINED RIGID/FLEX PRINTER CIRCUIT BOARD

This application is a 371 of PCT/U.S. Pat. No. 94/02437 filed Mar. 8, 1994.

The present invention elates to the fabrication of multilayer combined rigid and flex printed circuits having flexible printed circuits extending from the rigid board. In particular, the present invention relates to an improved process for the fabrication of a novel multilayer combined rigid and flex printed circuits, wherein the flex section has improved flexibility, thereby providing a rigid flex circuit with optimum flexibility in the connecting flex section.

Techniques for making multilayer rigid flex printed circuit boards are well known in the art. One early example of the prior art is disclosed in U.S. Pat. No. 3,409,732, assigned to the Assignee of the present application and whose teachings are incorporated by reference. Typically a rigid flex stacked printed circuit board includes flexible printed circuit cables extending from the periphery of the rigid section or sections. The rigid portions of the flex cables are typically used as sites for electronic components or mechanical hardware. It is important to note that the copper conductor in each plane or layer is fabricated from one continuous sheet of copper foil.

With improvements in electronic technology, there has been a constant need for advances in electronic packaging. This need has led to mere complex multilayer rigid flex printed circuit boards with many boards now using up to twenty-five, or even more, layers of circuitry. However, severe problems developed when the rigid circuit portions included many layers of conductors and holes plated through with copper to provide conductor barrels connecting the conductor layers.

One particular problem, reported on and discussed in U.S. Pat. No. 4,800,461, assigned to the assignee of the present Application, an whose teachings are incorporated by reference, described the fact that in multilayer rigid flex boards which included insulator materials such as acrylic adhesive and Kapton (Kapton is a trademark of E. I. dupont de Nemours and Company Inc. for polyimide film), the insulating materials placed a "Z-axis" stress on plated through holes. The coefficient of thermal expansion, it was reported, of the acrylic adhesive (Z-axis expansion) was the dominate influence. It was observed that because of the amount of acrylic required in many multilayer rigid flex applications, all plated through holes are stressed, with many cracking, making the boards unusable.

To overcome this problem, the '461 patent reported on a novel process to provide a rigid section incorporating insulator materials which, when subjected to elevated temperatures, did not expand in the Z direction to cause difficulties, including delamination and cracking of plated copper barrels. Stated another way, in the '461 patent, the materials causing undesirable expansion in the Z direction in the multilayer rigid section of the board, and the materials absorbing excessive amounts of moisture, such as acrylic adhesives and Kapton, were eliminated from the boards rigid section.

However, although the '461 patent was extremely successful in addressing the various problems recited therein, and in particular, the problem of thermal stresses described above, the process for fabrication of the rigid flex printed circuits has remained limited to the fabrication of a multilayer combined rigid and flex printed circuit board herein two circuit boards are always prepared from a basestock composition, and remain attached to one another via the prepreg. In other words, the process of fabrication according to the teachings of the prior art begin with the step of laminating two conductor layers (i.e. copper layers) to a single insulator layer (prepreg) followed by imaging and etching. Accordingly if one of the two bonded conductor layers was somehow improperly imaged, it was necessary to discard the entire lamination.

In order to solve the above mentioned problem, as reported on and discussed in PCT/U.S. Pat. No. 93/11684, filed Dec. 2, 1993, assigned to the assignee of the present application, and whose teachings are incorporated by reference, a process for the fabrication by a novel process and from a novel basestock composite was reported, wherein two copper sheets were laminated to a prepreg and in-between said laminated copper sheets was placed a release material that was not coextensive with the borders of the prepreg. Accordingly, the basestock could be imaged and processed in the usual manner, such that cutting the edges of the basestock material, after imaging, at a location internal to the basestock, provided a cut into the release layer, thereby allowing for separation of the two individual imaged copper layers and their supporting prepreg, along with the removal of said release material.

However, while the above solutions to certain problems in multilayer combined rigid and flex printed circuits each put to rest some longstanding problems in circuit manufacture, none of the described solutions addressed the problem of preparing a rigid flex circuit wherein maximum flexibility was developed in the flexible section of the circuit.

Accordingly, it is an object of this invention to provide a novel rigid flex printed circuit, and process for its fabrication, that improves the ductility or flexibility of the flex section.

It is also an object of this invention to provide a novel rigid flex print circuit, and process for its fabrication, wherein flexible insulating layers, preferably made of Kapton film, are positioned and configured in the circuit such that a hollow region is defined by said layers of Kapton, which hollow region also serves to enhance the flexibility of the rigid flex circuit so produced.

Finally, it is a particular object of this invention to disclose a layered rigid flex circuit, with enhanced flexibility, that is comprised of a laminated double sided basestock composite with a flexible core, two additional insulator prepreg sheets positioned on both sides of the basestock, wherein circuits are made in said additional insulator prepreg sheets at a region proximate to the flexible core, said cut out regions being filled with a flexible layer of Kapton affixed to the basestock composite by a suitable adhesive, and abutting and overlapping the edges of the cutout, whereupon stacking of the laminate so produced results in the formation of a hollow region as between the flexible Kapton layers, therein resulting in a rigid flex circuit with improved and optimum flexibility in the flex section.

This invention describes a multilayer rigid flex printed circuit board, wherein the board laminate comprises a double-sided basestock composite, formed by laminating two conducting sheets to an insulating layer, said insulator layer containing a flexible core, a second insulator layer affixed to each side of the basestock, said insulator having a cutout region proximate to the flexible core of the basestock composite, a flexible layer affixed to said cutout regions with an adhesive, wherein said flexible layer contacts the conducting layers and abuts and overlaps a portion of the second insulator layer such that upon stacking of the board laminate a hollow region is produced as between the stacked laminate sections. In an exemplary embodiment of the invention, the conducting sheets are copper sheets, preferably of one or two ounce copper, the flexible core and the flexible layers are preferably polyimide, such as Kapton, the insulator layers preferably comprised of one or two fiberglass sheets impregnated with an adhesive, preferably an epoxy or polyimide commonly referred to as a prepreg) and the polyimide is affixed to the laminate by an acrylic type adhesive.

In process form, the present invention describes a process of fabricating a rigid flex printed circuit comprising the steps of (a) laminating a pair of conductor layers to opposite surfaces of a first insulating layer, wherein said insulating layer contains a flexible insulating core; (b) imaging and etching said conductor layers to for conductor patterns; (c) laminating to the imaged and etched conductor layer a pair of rigid section insulating material each having a portion removed therefrom to form a cutout which is proximate to the flexible insulating core of said first insulating layer and which corresponds to the circuit board area to be made flexible; (d) affixing a pair of sheets of flexible section insulator material to the cutout section of said rigid section insulator layers, wherein said flexible section insulating material slightly overlaps each respective rigid section insulator layer at both edges of the cutout, thereby forming a first printed circuit structure containing two conductor layers; and stacking and laminating said first printed circuit structure with another first printed circuit structure prepared according to steps (a)–(d) above, wherein said stacking affords a hollow region as between said stacked printed circuit structures.

The foregoing and other features and advantages of the present invention will be more readily understood and will become apparent from the following detailed description taken in conjunction with the drawings, in which:

DETAILED DESCRIPTION

Figure 1:
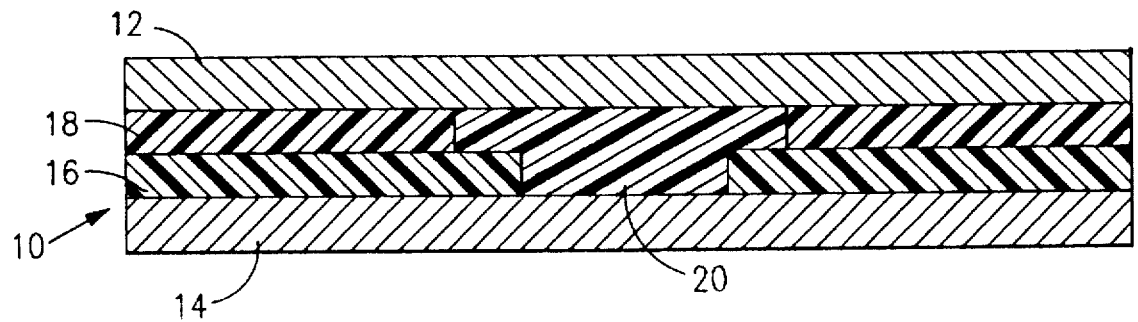
FIG. 1 is an exploded view of the novel basestock composite, containing a Kapton core.

In the first exemplary embodiment of the invention shown in FIG. 1, the basestock composite 10 is shown to comprise two copper conducting sheets 12 and 14, for example, one or two ounce copper, bonded to insulator layers 16 and 18 comprised of fiberglass sheets impregnated with an such as epoxy, and commonly referred to as a prepreg. Also shown in FIG. 1 is the flexible core 20, for example, a polyimide film such as Kapton, affixed to the 16 and 18 by an acrylic-type adhesively, it can be appreciated that in the method of preparation of the basestock composite 10, a pair of conducting or layers 12 and 14, are laminated to the opposite surfaces of insulating layers 16 and 18, containing flexible core 20. The basestock composite 10 comprising a pair of conducting sheets has sufficient planarity and rigidity to permit handling and further processing thereof, and in particular, imaging to form conductor patterns.

Figure 2:
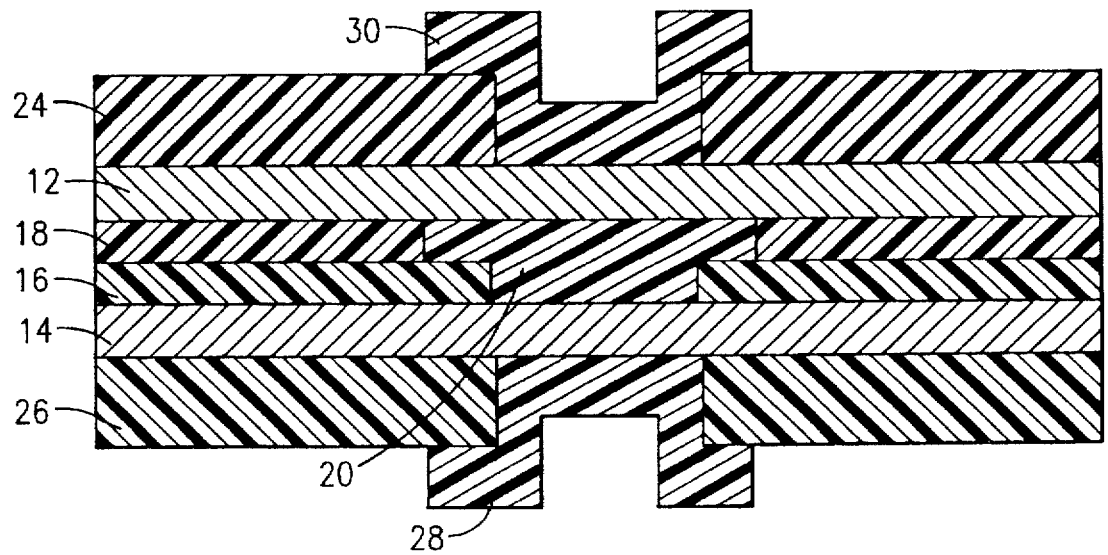
FIG. 2 is an exploded view of the novel basestock composite covered with a second insulator prepreg layer and a cutout region containing a Kapton/acrylic covering.

Turning now to FIG. 2, the basestock composite which has been imaged and etched to form conductor patterns are first treated to enhance bondability of another epoxy prepreg to the copper, shown at 24 and 26, by the black oxide process typically used in the rigid board field, or by way of a double treated foil. In addition, prepreg 24 and 26 have cutout regions which contain a flexible insulator film of Kapton, shown at 28 and 30, covered with a layer of suitable adhesive which provides excellent bonding of Kapton to copper. As shown in FIG. 2, the flexible layer of Kapton at 28 and 30 contacts the conducting layers and abuts and overlaps a portion of the second insulating layers 24 and 26. It is to be noted that the insulator layers such as Kapton and acrylic adhesive afford flexibility and tear resistance characteristics to the flex sections. Alternatively, the Kapton and adhesive can be replaced with a photoimagable solder mask.

Figure 3:
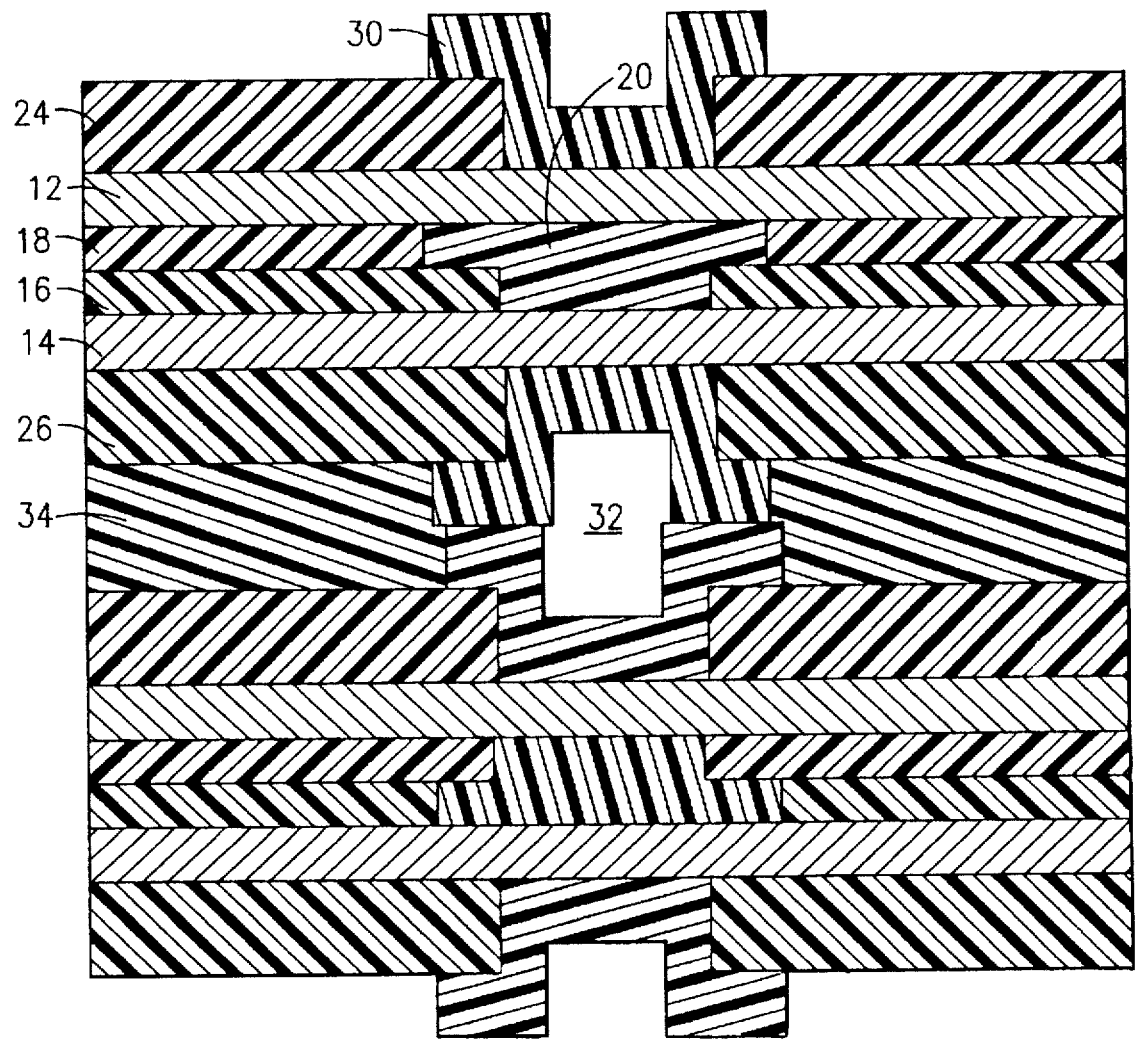
FIG. 3 is an exploded view of a stacked laminate of FIG. 2.
Figure 4:
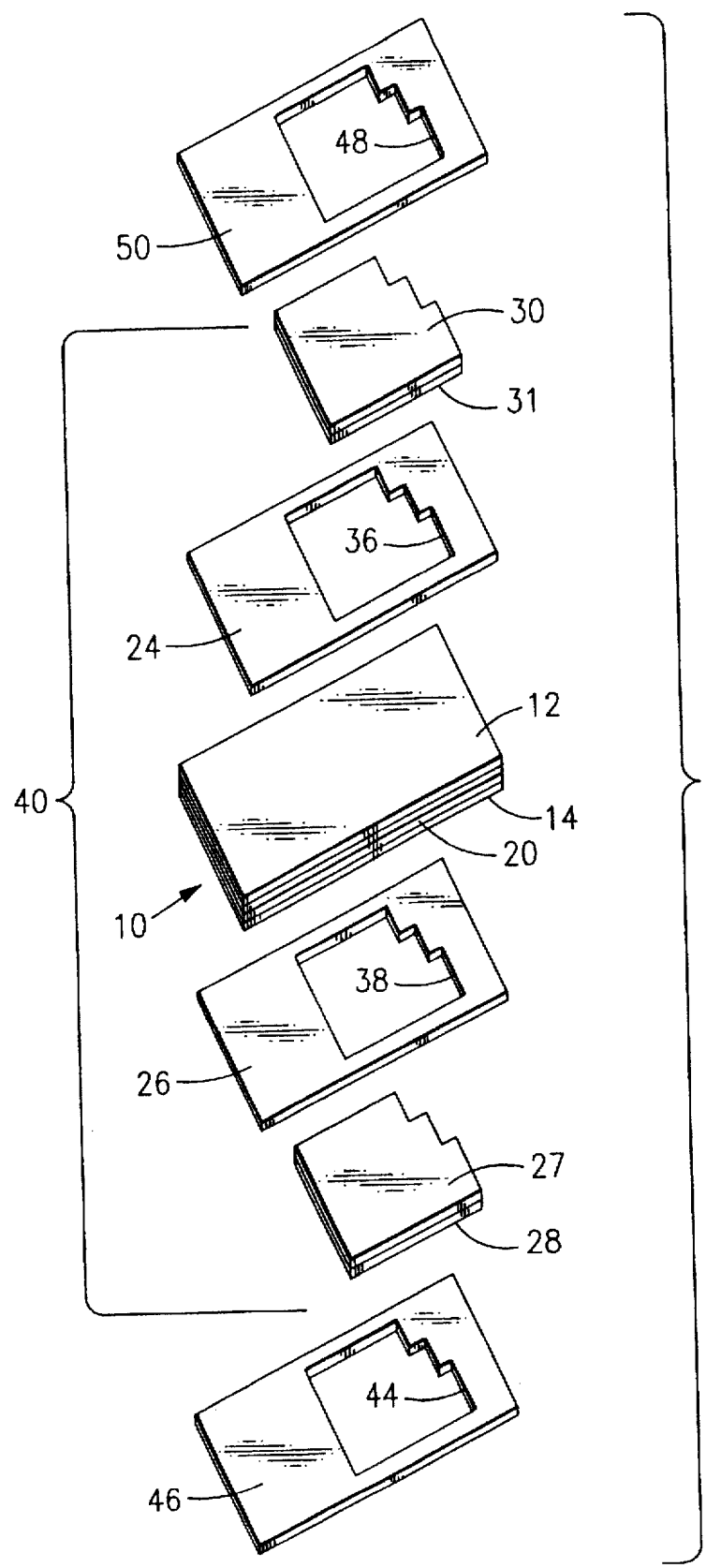
FIG. 4 is an exploded view of the sheet materials used to form the layers of structures forming inventive rigid flex circuit.
Figure 5:
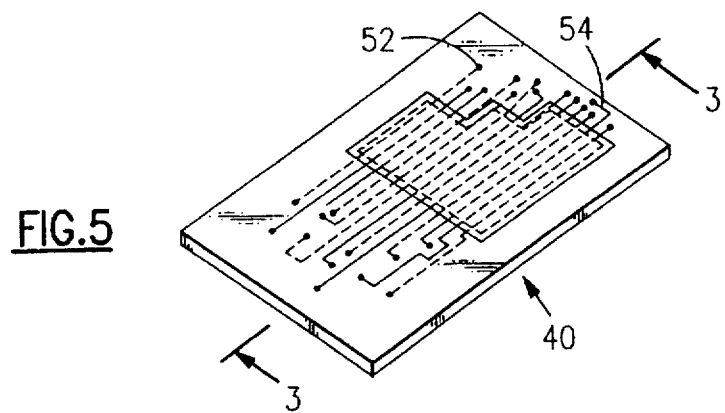
FIG. 5 is a view in perspective of the layers of FIG. 4 following lamination certain processing steps.

Turning now to FIG. 3, the laminate of FIG. 2 has been stacked such that a hollow region 32 can be seen as between the stacked laminate sections. The stacking can be readily achieved by laminating through the use of another prepreg sheet shown at 34.

In an exemplary embodiment of the invention shown in FIGS. 4–7, the formation of the multilayer rigid flex printed circuits begins with supplying the basestock composite 10 (which contains flexible core 20, as shown more clearly in FIG. 1) followed by an initial processing step which includes treating the exposed copper conductor patterns 12 and 14 to enhance bondability of another epoxy prepreg to the copper, for example, by the black oxide process typically used in the rigid board field, or by way of a double treated foil. It is to be noted that with respect to FIG. 4, the flexible core indicated generally at 20, is of a cross-sectional size that is substantially the same as that of the subsequent layers of flexible layers to be attached. One additional insulator prepreg sheets 24, having cutout 36, is positioned on one side of the base stock 10. A flexible insulator of Kapton 30, covered with a layer of suitable adhesive 31, for example, an acrylic adhesive which provides excellent bonding of Kapton to copper, is positioned on one side of the glass sheet 24. A similar sheet of Kapton 28 covered with a layer of adhesive 27 is located on the other side of the glass sheet 26. Insulator layers such as Kapton and acrylic adhesive afford flexibility and tear resistance characteristics to the flex sections, as discussed in connection with FIGS. 6 and 7. Alternatively, the Kapton 28 and adhesive 27 can be replaced with a photoimagable solder mask.

Figure 6:
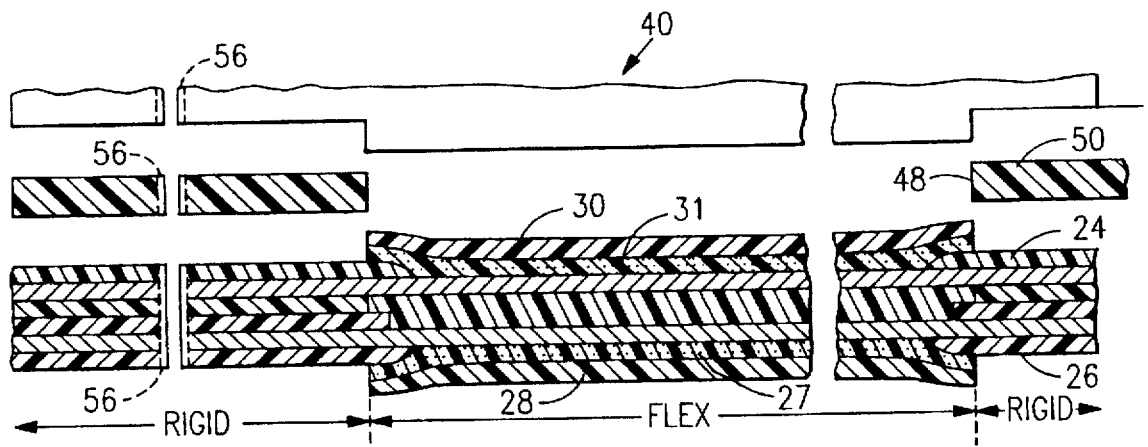
FIG. 6 is a cross-section taken along view line 3—3 in FIG. 5 and enlarged in interest of clarity.

As shown in FIG. 6, the Kapton sheets 28 and 30 and their associated adhesive layers 27 and 31 are slightly longer than the length of the cutouts 36 and 38 (FIG. 4) in the glass layers to overlap slightly the sheet 24 and 26 by, for example 0.050 inch. The sandwich formed by the foregoing sheets is then laminated together to provide the printed circuit structure 40 shown in FIGS. 4 and 5. Note that in the interests of clarity, the sides of the cutouts are not shown in FIG. 7.

After lamination processing, a number of the printed circuits 40 are stacked in proper registration with epoxy impregnated fiberglass layers 42 (FIG. 7) positioned between, for example, seven of the circuits 40. For clarity, only two of the printed circuit structures 40 are shown with the upper circuit 40 illustrated diagrammatically and broken away.

Note that cutouts 8 in the prepreg sheets 50 are slightly longer than the cutouts 36 (FIG. 4) and coextensive with the Kapton layers 28 and 30 so that the Kapton layers 28 and 30 abut the edges of the sheets 48, as shown in FIG. 6.

Figure 7:
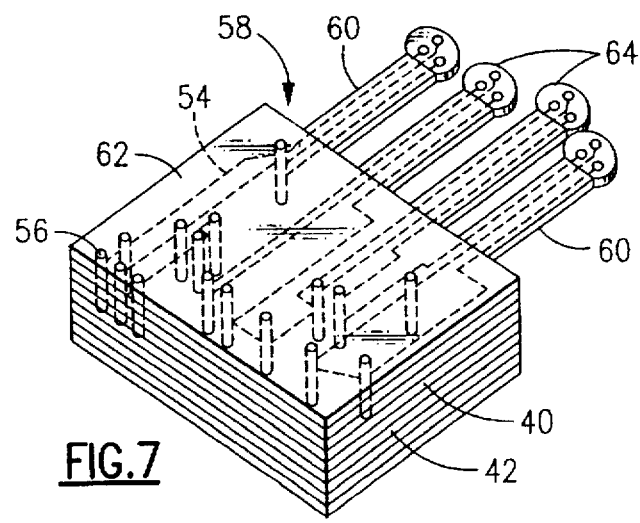
FIG. 7 is a perspective view diagrammatically showing the inventive rigid flex circuits following lamination and other processing steps the structures shown in FIGS. 5 and 6.

Prior to stacking the circuits 40, it is desirable to cut the flex cables, shown in FIG. 7, that extend through the cutout areas, to simplify the final construction of the rigid flex printed circuit structure.

After stacking seen of the circuits 40 with appropriate outer caps, the layers are laminated to provide, in this example, a nine layer rigid flex circuit (the outer caps add in this example one layer per cap), and holes are then drilled at appropriate pads 52 to interconnect desired conductors 54. The holes are then desmeared by a suitable process, for example, exposing them to appropriate cleaning chemicals to expose fully the copper conductors, a rapid process due to the absence of any adhesives or insulating material resistant to such chemicals, such as acrylics and Kapton, in the rigid circuit portion. If desired, plasma desmearing techniques can be used instead of chemical cleaning.

The holes are then plated through to interconnect desired conductors 54 a portion of a plated-through barrel 56 being shown in broken lines in FIG. 6, because it will not be formed until after lamination of the circuits 40 with the prepreg layers 50.

Referring next to FIG. 7, which shows somewhat diagrammatically a rigid flex circuit 58 with the plated through holes 56 enlarged, in the interests of clarity, flex cables 60 coextensive with the rigid and flex sections, and extending between the rigid sections 62 and 64 for suitably connecting the printed circuits. If desired, upper and lower caps are laminated to the circuits 40 in the rigid board area 62 only. Such caps typically are fabricated using polyimide glass or epoxy glass copper-clad laminates. Copper conductor circuits can be formed on one or both sides of the caps, as desired.

With the rigid section 62, and the portions of the flex cables coextension with the rigid section, formed by an insulator material, i.e., layers of fiberglass and adhesive, such as epoxy, which have characteristics or properties which allow the rigid board portion to relieve stresses, caused by heating, in the board, delamination of the circuits and cracking of the plated through barrels is prevented when the board, or portions thereof, is subjected to elevated temperatures.

In other words, the rigid board 62 does not contain troublesome materials, such as acrylic adhesive and Kapton, having high expansion rates and moisture absorption properties because the flex cable sections including Kapton and acrylic adhesive only extend to but not substantially into the rigid section. Of course the Kapton and acrylic layers could extend an insubstantial distance into the rigid section without causing undue problems. Further, selecting the inventive circuits to hot solder reflow and elevated temperatures will not cause differential expansion and contraction leading to cracking of the copper plated through barrels 56 or delamination of the layers. Moreover, extended baking times at temperatures on the order of 250° F. often as long as 48 hours, to remove moisture, are avoided.

While the invention enables the successful fabrication of multilayer rigid flex boards having a great number of conductor layers, the invention also provides excellent multilayer rigid flex boards having fewer layers, for example, on the order of as few as four conductor layers.

While the invention has been shown and described with reference to the above described embodiments, which provide rigid flex circuits affording advantages not found in prior art printed circuits, it will be understood that various changes may be made without departing from the spirit and scope of the invention as defined in the appended claims. For example, imaging and connection of the conductors of the circuits may be accomplished by covering the whole board with a layer of photoimagable solder mask to permit the whole board to be processed at once. Advantageously this greatly reduces the costs of performing this processing step, and thus, reduces the overall cost of the resulting board. Other modifications are also possible.

We claim:

1. A multilayer rigid flex printed circuit board, wherein the board laminate comprises:
    a double-sided basestock composite, formed by laminating two conducting sheets to an insulator layer, said insulator layer containing a flexible core;
    a second insulator layer affixed to each side of the basestock, said insulator having a cutout region proximate to the flexible core of the basestock composite; and
    a flexible layer affixed to said cutout regions with an adhesive, wherein said flexible layer contacts the conducting layers and abuts and overlaps a portion of the second insulator layer such that upon stacking of the laminate a hollow region is defined as between said stacked laminate sections.

2. The multilayer rigid flex printed circuit board of claim 1 wherein the conducting sheets are copper sheets of one or two ounce copper.

3. The multilayer rigid flex printed circuit board of claim 1 wherein the double-sided basestock composite contains as the insulator layer a fiberglass sheet impregnated with an epoxy adhesive.

4. The multilayer rigid flex printed circuit board of claim 1 wherein the flexible core of the basestock is a polyimide film.

5. The multilayer rigid flex circuit board of claim 4 wherein the polyimide film is Kapton.

6. The multilayer rigid flex printed circuit board of claim 1 wherein the flexible layer is a polyimide film.

7. The multilayer rigid flex printed circuit board of claim 6 wherein the polyimide film is Kapton.

8. The multilayer rigid flex printed circuit board of claim 1, wherein the adhesive for affixing the flexible layer to the cutout region is an acrylic adhesive.

9. A multilayer rigid flex printed circuit board, wherein the board laminate comprises:
    a double-sided basestock composite, formed by laminating two conducting sheets to an insulator layer containing a flexible polyimide film core;
    a second insulator layer affixed to each side of the basestock, said insulator having a cutout region proximate to the polyimide film core of the basestock; and
    a polyimide film layer affixed to said cutout regions with an adhesive, wherein said polyimide layer contacts the conducting layers and abuts and overlaps the second insulator layer such that upon stacking the laminate a hollow region is defined as between said stacked laminate sections.

10. A process of fabricating a rigid flex printed circuit comprising the steps of:
    (a) laminating a pair of conductor layers to opposite surfaces of a first insulating layer, wherein said insulating layer contains a flexible insulating core;
    (b) imaging and etching said conductor layers to form conductor patterns;

(c) laminating to the imaged and etched conductor layer a pair of rigid section insulator material each having a portion removed therefrom to form a cutout which is proximate to the flexible insulating core of said first insulating layer and which corresponds to the circuit board area to be made flexible;

(d) affixing a pair of sheets of flexible section insulator material to the cutout section of said rigid section insulator layers, wherein said flexible section insulating material slightly overlaps each respective rigid section insulator layer at both edges of the cutout therein, thereby forming a first printed circuit structure containing two conductor layers; and stacking and laminating said first printed circuit structure with another first printed circuit structure prepared according to steps (a)–(d) above, wherein said stacking affords a hollow region as between said stacked printed circuit structures.

11. The process of claim 10 wherein the flexible core in step (a) is comprised of a polyimide material, covered with an acrylic adhesive.

12. The process of claim 10 wherein the sheets of flexible section insulator material in step (d) are polyimide sheets covered with an acrylic adhesive.

13. The process of claim 11 wherein the polyimide material is Kapton.

14. The process of claim 10 wherein said rigid section insulator material in step (c) is fiberglass impregnated with a thermally-activated epoxy adhesive.

15. The process for fabrication of printed circuit boards as defined in claim 10, wherein said process includes the additional steps of stacking a plurality of said first printed circuit structures prepared according to steps (a)–(d), to form a multilayer rigid flex printed circuit structure having rigid and flexible sections; and drilling holes in the rigid section of said rigid flex printed circuit structure; and plating through said holes to form conductive barrels connecting conductors in the conductor patterns whereby the printed circuit structure is a rigid flex circuit having flexible cables cut from the areas coextensive with the cutout portions and extending from the rigid section.

* * * * *